(12) United States Patent
Son et al.

(10) Patent No.: US 8,803,607 B2
(45) Date of Patent: Aug. 12, 2014

(54) POWER AMPLIFIER

(75) Inventors: Ki Yong Son, Daejeon (KR); Gyu Suck Kim, Seoul (KR); Yoo Sam Na, Seoul (KR); Song Cheol Hong, Daejeon (KR); Bon Hoon Koo, Daejeon (KR)

(73) Assignees: Samsung Electro-Mechanics Co., Ltd., Suwon, Gyunggi-Do (KR); Korea Advanced Institute of Science & Technology, Yuseong-Gu, Daejeon (KR)

( * ) Notice: Subject to any disclaimer, the term of this patent is extended or adjusted under 35 U.S.C. 154(b) by 213 days.

(21) Appl. No.: 13/407,382

(22) Filed: Feb. 28, 2012

(65) Prior Publication Data

US 2013/0162350 A1 Jun. 27, 2013

(30) Foreign Application Priority Data

Dec. 22, 2011 (KR) .................. 10-2011-0140038

(51) Int. Cl.
*H03F 1/26* (2006.01)
(52) U.S. Cl.
USPC .......... 330/149; 330/124 R; 330/278; 330/107
(58) Field of Classification Search
USPC ................................. 330/149, 124 R, 278, 107
See application file for complete search history.

(56) References Cited

U.S. PATENT DOCUMENTS

| | | | | |
|---|---|---|---|---|
| 6,404,823 B1 * | 6/2002 | Grange et al. | ................ | 375/297 |
| 6,993,301 B1 * | 1/2006 | Kenington et al. | ........ | 455/114.3 |
| 7,289,573 B2 * | 10/2007 | Fusco et al. | .................... | 375/295 |
| 7,609,781 B2 * | 10/2009 | Kerth et al. | .................... | 375/297 |
| 8,139,674 B2 * | 3/2012 | Jaso | ............................. | 375/295 |
| 2012/0249238 A1 * | 10/2012 | Bartram | ....................... | 330/127 |

FOREIGN PATENT DOCUMENTS

KR 10-2001-0063565 A 7/2001

OTHER PUBLICATIONS

Korean Office Action, and English translation thereof, issued in Korean Patent Application No. 10-2011-0140038 dated Jan. 14, 2013.
Xiao, M.X., et al. "A Simple and Effective RF Predistorter for use in the HPAs of Base Stations in Cellular Mobile Systems". IEEE Int. Conference on Communication Systems. pp. 805-808, 2008.

* cited by examiner

*Primary Examiner* — Patricia Nguyen
(74) *Attorney, Agent, or Firm* — McDermott Will & Emery LLP

(57) ABSTRACT

There is provided a power amplifier capable of increasing linear output power and efficiency without sacrificing an overall gain by employing a vector modulation function in a driving stage, with no separate vector modulator. The power amplifier includes a driving stage performing vector-modulation on an input RF signal to provide an I channel signal and a Q channel signal having different phases and amplifying the I channel signal and the Q channel signal to set gains; and a power stage amplifying power levels of the signals amplified by the driving stage.

14 Claims, 6 Drawing Sheets

POWER AMPLIFIER

CROSS-REFERENCE TO RELATED APPLICATIONS

This application claims the priority of Korean Patent Application No. 10-2011-0140038 filed on Dec. 22, 2011, in the Korean Intellectual Property Office, the disclosure of which is incorporated herein by reference.

BACKGROUND OF THE INVENTION

1. Field of the Invention

The present invention relates to a power amplifier capable of compensating for a distortion of an output signal.

2. Description of the Related Art

As various devices in the field of mobile communications have recently come into widespread use, research into elements configuring mobile communications devices is being conducted. In particular, research into a power amplifier is being actively conducted.

A power amplifier, a device for amplifying input signal power, compensates for a distortion of an output signal using a radio frequency (RF) predistorter to increase linearity. Although a maximum linearity output may be increased due to a gain reduction in the power amplifier, overall efficiency may be disadvantageously reduced.

SUMMARY OF THE INVENTION

An aspect of the present invention provides a power amplifier capable of increasing linear output power and efficiency without sacrificing an overall gain by employing a vector modulation function in a driving stage, with no separate vector modulator.

According to an aspect of the present invention, there is provided a power amplifier including: a driving stage performing vector-modulation on an input RF signal to provide an I channel signal and a Q channel signal having different phases and amplifying the I channel signal and the Q channel signal to set gains; and a power stage amplifying power levels of the signals amplified by the driving stage.

The driving stage may include a vector modulator performing vector-modulation on the input RF signal and providing the I channel signal and the Q channel signal; an amplification unit including a first amplifier amplifying the I channel signal from the vector modulator to a set gain and a second amplifier amplifying the Q channel signal therefrom to a preset gain; and a vector combiner combining the I channel signal and the Q channel signal amplified by the amplification unit into a signal having a single phase.

The power amplifier may further include: a control unit providing an I channel control signal and a Q channel control signal for setting the gains of the driving stage.

The control unit may provide the I channel control signal and the Q channel control signal for setting the gains of the driving stage according to envelope information of the input RF signal.

The control unit may further provide an I channel control signal and a Q control signal for controlling phases of the I channel signal and the Q channel signal.

The power amplifier may further include: a rear driving stage disposed between the driving stage and the power stage, re-amplifying the signals amplified by the driving stage to preset gains, or attenuating the signals to preset levels to transfer the signals to the power stage.

The power amplifier may further include: a front driving stage amplifying the input RF signal to a preset gain, or attenuating the signal to a preset level to transfer the signal to the driving stage.

According to another aspect of the present invention, there is provided a power amplifier including: a driving stage performing vector-modulation on an input RF signal to provide an I channel signal and a Q channel signal having different phases and attenuating the I channel signal and the Q channel signal to set levels; and a power stage amplifying power levels of the signals amplified by the driving stage.

The driving stage may include: a vector modulator performing vector-modulation on the input RF signal and providing the I channel signal and the Q channel signal; an attenuation unit including a first attenuator attenuating a signal level of the I channel signal from the vector modulator to a set level and a second attenuator attenuating a signal level of the Q channel signal therefrom to a preset level; and a vector combiner combining the I channel signal and the Q channel signal attenuated by the attenuation unit into a signal having a single phase.

The power amplifier may further include: a control unit providing an I channel control signal and a Q channel control signal for setting an attenuation level of the driving stage.

The control unit may provide the I channel control signal and the Q channel control signal for setting the attenuation level of the driving stage according to envelope information of the input RF signal.

The power amplifier may further include: a rear driving stage disposed between the driving stage and the power stage, amplifying the signals attenuated by the driving stage to preset gains, or re-attenuating the signals to preset levels to transfer the signals to the power stage.

The power amplifier may further include: a front driving stage amplifying the input RF signal to a preset gain, or attenuating the signal to a preset level to transfer the signal to the driving stage.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Embodiments of the present invention will now be described in detail with reference to the accompanying drawings.

Figure 1:
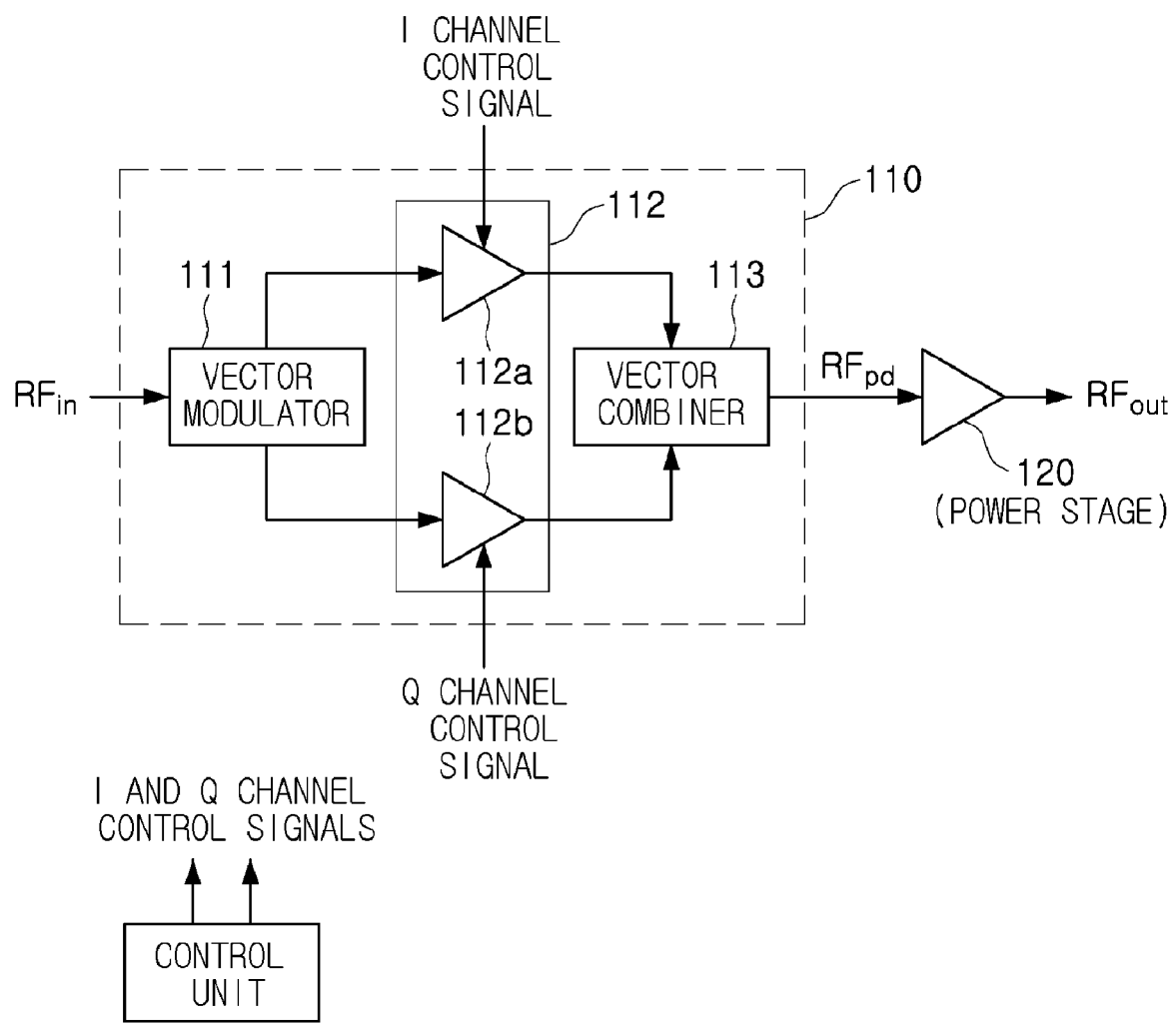
FIG. 1 is a schematic configuration diagram of a power amplifier according to an embodiment of the present invention.

FIG. 1 is a schematic configuration diagram of a power amplifier according to an embodiment of the present invention.

Referring to FIG. 1, a power amplifier 100 according to the embodiment of the present invention may include a driving stage 110, a power stage 120, and a control unit 130.

The driving stage 110 may include a vector modulator 111, an amplification unit 112, and a vector combiner 113.

The vector modulator 111 may modulate an input RF signal RFin in a quadrature amplification modulation (QAM) scheme. The QAM scheme is a modulation scheme in which data is transmitted by changing and controlling amplitudes and phases of independent two carrier waves, i.e. an in-phase carrier wave and a quadrature carrier wave. The two carrier waves (usually sinusoids) are in quadrature with each other by 90°.

That is, the vector modulator 111 may perform vector-modulation on the input RF signal RFin to provide the amplification unit 112 with an I channel signal and a Q channel signal having different phases.

The amplification unit 112 may include a first amplifier 112a and a second amplifier 112b, and the respective first amplifier 112a and the second amplifier 112b may amplify signal levels of the I channel signal and the Q channel signal according to set gains. An active device of the first amplifier 112a and an active device of the second amplifier 112b may have the same structure or different structures in terms of the size thereof, or the like.

The gains of the first amplifier 112a and the second amplifier 112b may be set according to an I channel control signal and a Q channel control signal. Meanwhile, the I channel control signal and the Q channel control signal may control phases of the I channel signal and the Q channel signal amplified by the first amplifier 112a and the second amplifier 112b.

The vector combiner 113 may combine the I channel signal and the Q channel signal to output a signal having a single phase. The vector combiner 113 may be implemented using a method of connecting signal paths of the I channel signal and the Q channel signal to form a single signal path.

The power stage 120 may amplify a power level of a signal RFpd from the vector combiner 113 to a preset level to output a signal RFout.

The control unit 130 may provide the I channel control signal and the Q channel control signal for setting the gains of the first amplifier 112a and the second amplifier 112b. Each of the I channel control signal and the Q channel control signal may be an analog signal or a digital signal. In addition, the control unit 130 may use the I channel control signal and the Q channel control signal to control the phases of the I channel signal and the Q channel signal of the first amplifier 112a and the second amplifier 112b. That is, the phases of the I channel signal and the Q channel signal may be varied in accordance with variances in the gains of the first amplifier 112a and the second amplifier 112b. However, the phases of the I channel signal and the Q channel signal may be maintained to be constant.

Figure 5:
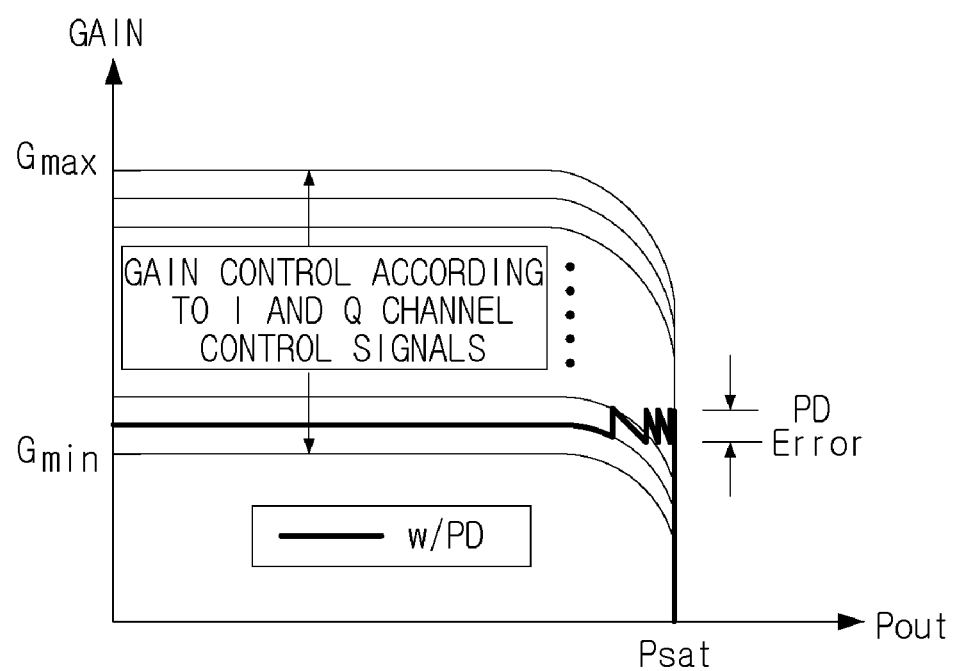
FIGS. 5 and 6 are AM-AM and AM-PM compensation graphs of the power amplifier according to the embodiment of the present invention.
Figure 6:
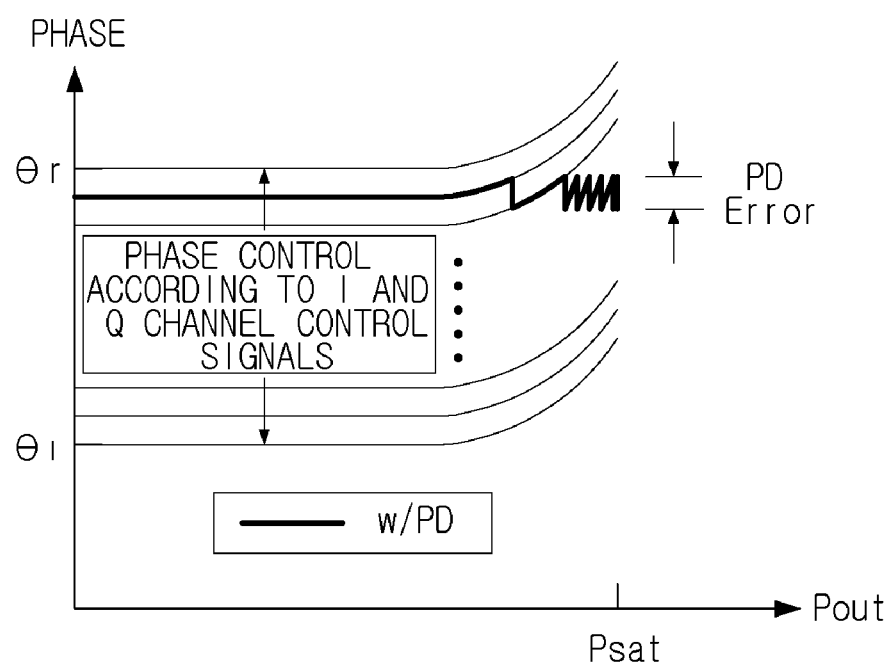

FIGS. 5 and 6 are AM-AM and AM-PM compensation graphs of the power amplifier according to the embodiment of the present invention.

Referring to FIGS. 1, 5, and 6, final gain and phase modulation ranges may be determined according to gain control on the gains of the first amplifier 112a and the second amplifier 112b. The final gain and phase modulation ranges may be considered based on magnitudes of an amplitude distortion AM-AM and a phase distortion AM-PM in the power stage 120.

Therefore, the control unit 130 may provide the first amplifier 112a and the second amplifier 112b with the I channel control signal and the Q channel control signal and control the gains of the first amplifier 112a and the second amplifier 112b and the phases of the I channel signal and the Q channel signal of the first amplifier 112a and the second amplifier 112b to thereby compensate for the amplitude distortion AM-AM and the phase distortion AM-PM in the power stage 120.

To this end, the control unit 130 may include a lookup table having voltage values of the I channel control signal and the Q channel control signal according to an instant magnitude of the input RF signal RFin. The I channel control signal and the Q channel control signal having voltage values corresponding to the instant magnitude of the input RF signal RFin in the lookup table may be provided to the first amplifier 112a and the second amplifier 112b. The instant magnitude of the input RF signal RFin may be confirmed from envelope information on the input RF signal RFin.

Figure 2:
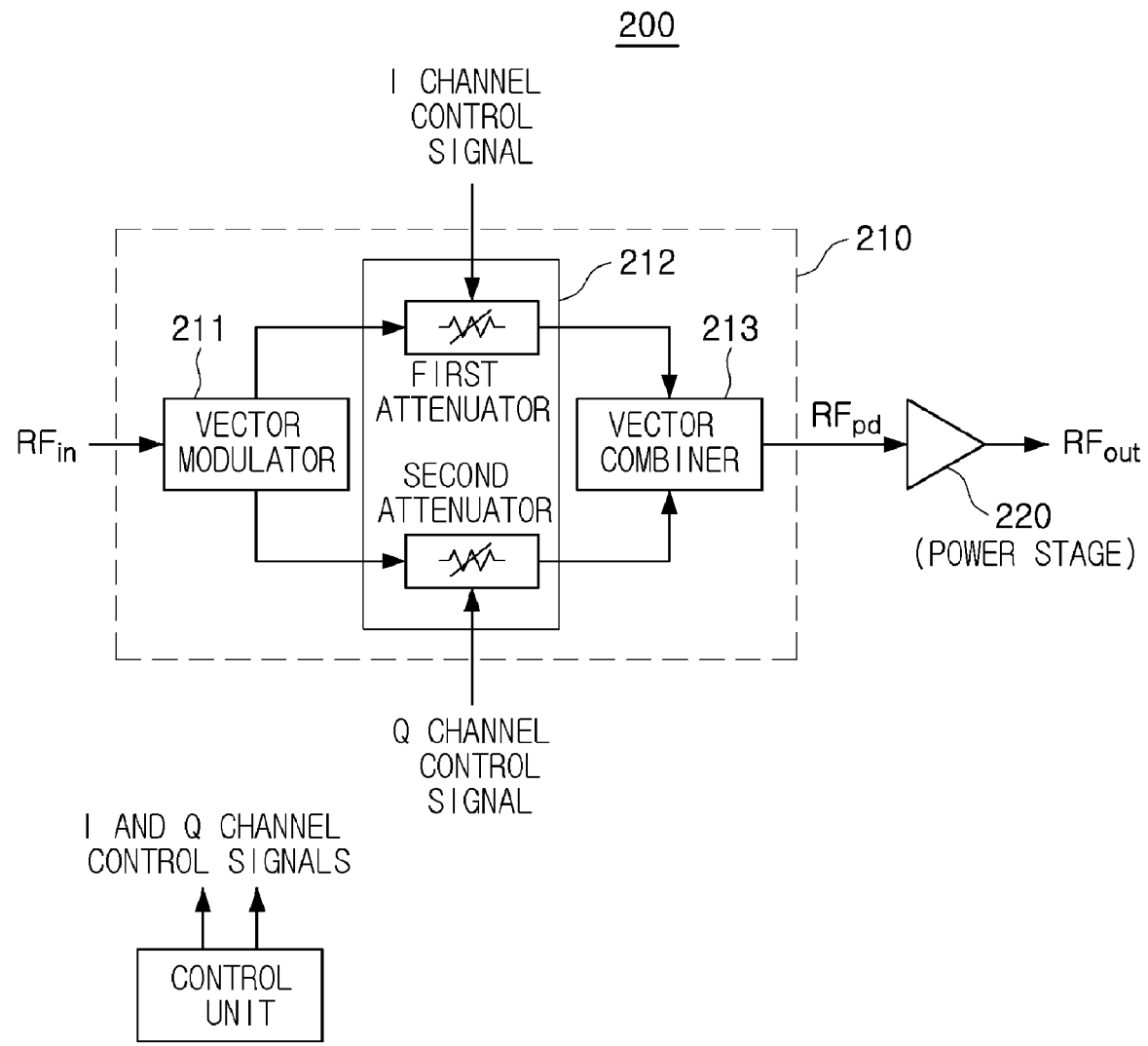
FIG. 2 is a schematic configuration diagram of a power amplifier according to another embodiment of the present invention.

FIG. 2 is a schematic configuration diagram of a power amplifier according to another embodiment of the present invention.

Referring to FIG. 2, a power amplifier 200 of the embodiment may include a driving stage 210, a power stage 220, and a control unit 230.

The power stage 220 may be the same as the power stage 120 of the power amplifier 100 of FIG. 1, and thus a detailed description thereof will be omitted.

The driving stage 210 may include a vector modulator 211, an attenuation unit 212, and a vector combiner 213.

In this regard, the vector modulator 211 and the vector combiner 213 may be the same as the vector modulator 111 and the vector combiner 113 of the power amplifier 100 of FIG. 1, and thus detailed descriptions thereof will be omitted.

The attenuation unit 212 may include a first attenuator 212a and a second attenuator 212b.

The respective first attenuator 212a and the second attenuator 212b may attenuate levels of an I channel signal and a Q channel signal having different phases from the vector modulator 211 at set ratios according to an I channel control signal and a Q channel control signal of the control unit 230. Each of the I channel control signal and the Q channel control signal may be an analog signal or a digital signal.

In this regard, the control unit 130 may use the I channel control signal and the Q channel control signal to control phases of the I channel signal and the Q channel signal of the first attenuator 212a and the second attenuator 212b. That is, the phases of the I channel signal and the Q channel signal may be varied in accordance with variances in the attenuation ratios of the first attenuator 212a and the second attenuator 212b. However, the phases of the I channel signal and the Q channel signal may be maintained to be constant.

The control unit 230 may provide the first attenuator 212a and the second attenuator 212b with the I channel control signal and the Q channel control signal and control the attenuation ratios of the first attenuator 212a and the second attenuator 212b and the phases of the I channel signal and the Q channel signal of the first attenuator 212a and the second attenuator 212b to thereby compensate for the amplitude distortion AM-AM and the phase distortion AM-PM in the power stage 220.

To this end, the control unit 230 may include a lookup table having voltage values of the I channel control signal and the Q channel control signal according to the instant magnitude of the input RF signal RFin. The I channel control signal and the Q channel control signal having voltage values corresponding to the instant magnitude of the input RF signal RFin in the lookup table may be provided to the first attenuator 212a and the second attenuator 212b. The instant magnitude of the input RF signal RFin may be confirmed from envelope information on the input RF signal RFin.

Meanwhile, a gain of the power amplifier 200 may also be reduced according to the attenuation ratios of the first attenuator 212a and the second attenuator 212b. The attenuation ratio controlled according to the respective I channel control signal and the Q channel control signal may be ensured to a minimum value or greater in such a manner that power added efficiency (PAE) may not be greatly reduced as compared to drain efficiency (DE).

Figure 3:
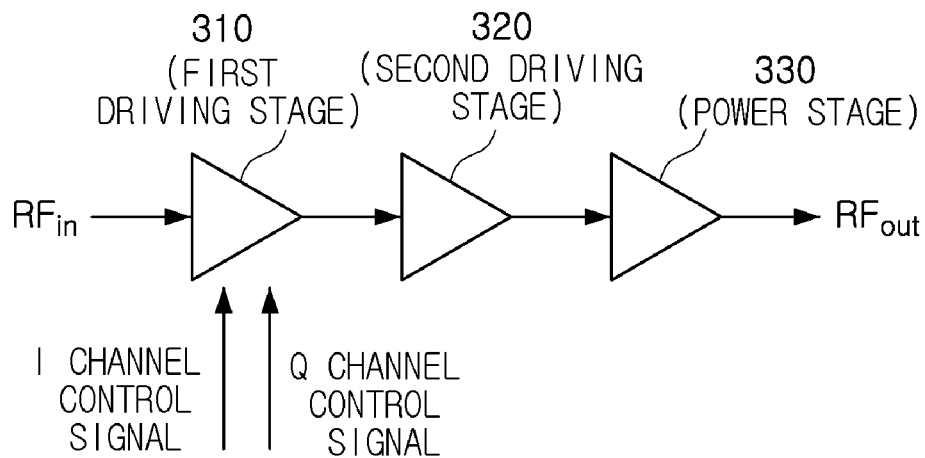
FIG. 3 is a schematic diagram showing a multi-step structure of a power amplifier according to another embodiment of the present invention.
Figure 4:
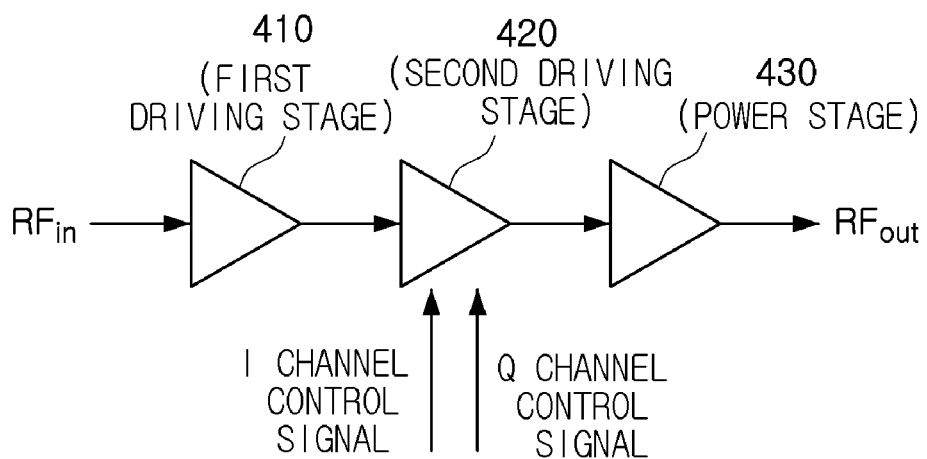
FIG. 4 is a schematic diagram showing a multi-step structure of a power amplifier according to another embodiment of the present invention.

FIG. 3 is a schematic diagram showing a multi-step structure of a power amplifier according to another embodiment of the present invention. FIG. 4 is a schematic diagram showing a multi-step structure of a power amplifier according to another embodiment of the present invention.

Referring to FIG. 3, a power amplifier 300 having a multi-step structure according to another embodiment may include first and second driving stages 310 and 320 and a power stage 330.

In this regard, the first driving stage 310 may be the same as the driving stage 110 or 210 of FIG. 1 or 2, and the power stage 330 may also be the same as the power stage 120 or 220 of FIG. 1 or 2.

The second driving stage 320 may amplify a signal from the first driving stage 310 according to a set gain or may attenuate a signal level thereof at a set ratio.

Likewise, referring to FIG. 4, a power amplifier 400 having a multi-step structure according to another embodiment may include first and second driving stages 410 and 420 and a power stage 430.

In this regard, the second driving stage 420 may be the same as the driving stage 110 or 210 of FIG. 1 or 2, and the power stage 430 may also be the same as the power stage 120 or 220 of FIG. 1 or 2.

The first driving stage 410 may amplify the input RF signal RFin according to a set gain or may attenuate a signal level thereof at a set ratio to transfer the attenuated input RF signal RFin to the second driving stage 420.

Although a control unit is not shown in FIGS. 3 and 4, based on the fact that the first driving stage 310 or 410, or the second driving stage 320 or 420 may be the same as the driving stage 110 or 210 of FIG. 1 or 2, the control unit 130 or 230 of FIG. 1 or 2 may be employed to the power amplifier 300 or 400 having the multi-step structure shown in FIG. 3 or 4.

The graph of FIG. 5 shows a process of compensating for an AM-AM distortion through a control signal in accordance with an envelope of the power amplifier according to the embodiment of the present invention. A plurality of parallel gain curves may show electrical characteristics in a state in which channel control signals are fixed, i.e., in a state in which a predistortion function is not performed, and a single gain curve denoted by w/PD is an example of a gain curve when the predistortion function is performed.

Each parallel gain curve indicates a gain in a state in which the I channel control signal and the Q channel control signal are fixed. In the power amplifier 100, 200, 300, or 400 according to the embodiment of the present invention, an absolute value of the overall gain may be varied through the control of the driving stage 110 or 210. Meanwhile, irrespectively of the values of the channel control signals, the power stage 120, 220, 330, or 430, which is a final terminal, operates at a uniform bias all the time, and thus linearity characteristics such as P1dB or the like may be uniform. That is, each parallel gain curve has a form in which the absolute value moves in a parallel manner in the same state.

If predistortion is applied in a vector modulation scheme as in the power amplifier according to the embodiment of the present invention, the channel control signals are varied according to the magnitude of the RF input signal, and thus the plurality of gain curves may select the channel control signals. Through the above process, the single gain curve denoted by w/PD of FIG. 5 has a smaller variation (reduced distortion) than that of the gain curves in a state in which the control channel signals are fixed.

The channel control signals of the power amplifiers according to the embodiments of the present invention may be in the form of digital signals. The control signals output by the lookup tables of the control units 130 and 230 may be digital signals, and an additional employment of a digital-analog converter may be excluded. However, since the channel control signals in the form of digital signals may have fixed gain sizes that can be controlled to least significant bits (LSBs) thereof, limitations in resolution according to variable characteristics of the first and second amplifiers 112a and 112b controlled based on the LSBs of the channel control signals may exist.

The gain curve denoted by w/PD may do not have a completely uniform value and accompany with a small error due to the limitations in resolution. This is shown in FIG. 5 as a predistortion (PD) error in the structure according to the embodiment of the present invention, but does not disturb an improvement in the linearity characteristics of the power amplifier.

The graph of FIG. 6 shows a process of compensating for an AM-PM distortion through a control signal in accordance with an envelope of the power amplifier according to the embodiment of the present invention. A plurality of parallel phase curves may show electrical characteristics in a state in which channel control signals are fixed, i.e., in a state in which a predistortion function is not performed, and a single phase curve denoted by w/PD is an example of a phase curve when the predistorion function is performed.

Each parallel phase curve indicates a phase in a state in which the I channel control signal and the Q channel control signal are fixed. In the power amplifier 100 or 200 according to the embodiment of the present invention, an absolute value of the overall phase may be varied through the control of the driving stage 110 or 210. Meanwhile, irrespectively of the values of the channel control signals, the power stage 120, 220, 330, or 430, which is a final terminal, operates at a uniform bias all the time, and thus linearity characteristics such as P1dB or the like may be uniform. That is, each parallel phase curve has a form in which the absolute value moves in a parallel manner in the same state.

If predistortion is applied in a vector modulation scheme as in the power amplifier according to the embodiment of the present invention, the channel control signals are varied according to the magnitude of the RF input signal, and thus the plurality of phase curves may select the channel control signals. Through the above process, the single phase curve denoted by w/PD of FIG. 6 has a smaller variation (reduced distortion) than that of the phase curves in a state in which the control channel signals are fixed.

The channel control signals of the power amplifiers according to the embodiments of the present invention may be in the form of digital signals. The control signals output by the lookup tables of the control units 130 and 230 may be digital signals, and an additional employment of a digital-analog converter may be excluded. However, since the channel control signals in the form of digital signals may have fixed gain sizes that can be controlled to least significant bits (LSBs) thereof, limitations in resolution according to variable characteristics of the first and second amplifiers 112a and 112b controlled based on the LSBs of the channel control signals may exist.

The phase curve denoted by w/PD may do not have a completely uniform value and accompany with a small error due to the limitations in resolution. This is shown in FIG. 6 as a predistortion (PD) error in the structure according to the embodiment of the present invention, but does not disturb an improvement in the linearity characteristics of the power amplifier.

As described above, the control units 130 and 230 may generate the I and Q channel control signals to apply the I and Q channel control signals to the driving stages 110, 210, 310, 320, 410 and 420 in consideration of the gain and the phase curves of FIGS. 5 and 6, thereby improving the linearity characteristics.

Figure 7:
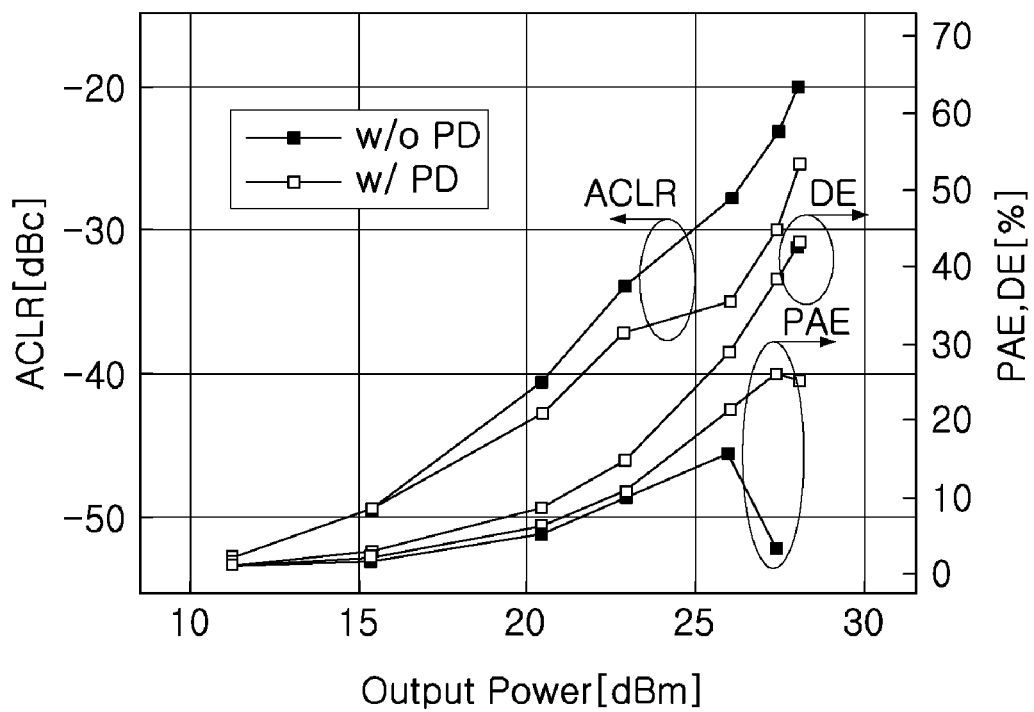
FIG. 7 is a graph of linearity of the power amplifier according to the embodiment of the present invention.

FIG. 7 is a graph of linearity of the power amplifier according to the embodiment of the present invention.

As described above, according to the embodiment of the present invention, a predistortion scheme according to envelope information may be used without sacrificing the overall gain and without using a separate vector modulator, thereby simultaneously increasing linear output power and efficiency.

Referring to FIG. 7, bias power is applied to the power stage according to the embodiment of the present invention so that the power stage operates as a class-A, and a WCDMA signal is used to measure linearity of the power amplifier according to the embodiment of the present invention. As shown in FIG. 7, when a predistortion (PD) function is applied to the power amplifier according to the embodiment of the present invention (w/PD), adjacent channel leakage ratio (ACLR) characteristics at the same output power are enhanced as compared to the case in which the PD function is not applied thereto (w/o PD), and DE and PAE are also enhanced as shown in FIG. 7.

As described above, according to the embodiments of the present invention, linearity of an output signal of a power amplifier may be increased by performing predistortion according to a vector modulation scheme. Linear output and power conversion efficiency may be increased by performing predistortion according to envelope information on an input signal without employing a vector modulator as a separate element by implementing the vector modulation scheme in a driving stage. The fixed value may not be used for predistortion, and channel control signals varying according to the envelope information on the input signal may be generated, thereby overcoming a modulation range of the predistortion and limitations in the degree of freedom, and thus an improvement of a maximum linear power point may be expected.

As set forth above, according to the embodiments of the present invention, linear output power and efficiency can be increased, and a circuit size can be reduced without sacrificing an overall gain by employing a vector modulation function in a driving stage, with no separate vector modulator.

While the present invention has been shown and described in connection with the embodiments, it will be apparent to those skilled in the art that modifications and variations can be made without departing from the spirit and scope of the invention as defined by the appended claims.

What is claimed is:

1. A power amplifier comprising:
    a driving stage performing vector-modulation on an input RF signal to provide an I channel signal and a Q channel signal having different phases and amplifying the I channel and the Q channel signal to set gains; and
    a power stage amplifying power levels of the signals amplified by the driving stage,
    wherein the driving stage amplifies the I channel signal and the Q channel signal to gains set based on preset values stored in a lookup table and selected according to envelope information of the input RF signal.

2. The power amplifier of claim 1, wherein the driving stage includes:
    a vector modulator performing vector-modulation on the input RF signal and providing the I channel signal and the Q channel signal;
    an amplification unit including a first amplifier amplifying the I channel signal from the vector modulator to a set gain and a second amplifier amplifying the Q channel signal therefrom to a preset gain; and
    a vector combiner combining the I channel signal and the Q channel signal amplified by the amplification unit into a signal having a single phase.

3. The power amplifier of claim 1, further comprising a control unit providing an channel control signal and a Q channel control signal for setting the gains of the driving stage.

4. The power amplifier of claim 3, wherein the control unit provides the I channel control signal and the Q channel control signal for setting the gains of the driving stage according to envelope information of the input RF signal.

5. The power amplifier of claim 3, wherein the control unit further provides an I channel control signal and a Q control signal for controlling phases of the I channel signal and the Q channel signal.

6. The power amplifier of claim 1, further comprising a rear driving stage disposed between the driving stage and the power stage, re-amplifying the signals amplified by the driving stage to preset gains, or attenuating the signals to preset levels to transfer the signals to the power stage.

7. The power amplifier of claim 1, further comprising a front driving stage amplifying the input RF signal to a preset gain, or attenuating the signal to a preset level to transfer the signal to the driving stage.

8. A power amplifier comprising:
    a driving stage performing vector-modulation on an input RF signal to provide an I channel signal and a Q channel signal having different phases and attenuating the I channel signal and the Q channel signal to set levels; and
    a power stage amplifying power levels of the signals amplified by the driving stag;
    wherein the driving stage attenuates the I channel signal and the Q channel signal to levels set based on preset values stored in a lookup table and selected according to envelope information of the input RF signal.

9. The power amplifier of claim 8, wherein the driving stage includes:
    a vector modulator performing vector-modulation on the input RF signal and providing the I channel signal and the Q channel signal;
    an attenuation unit including a first attenuator attenuating a signal level of the I channel signal from the vector modulator to a set level and a second attenuator attenuating a signal level of the Q channel signal therefrom to a preset level; and
    a vector combiner combining the I channel signal and the Q channel signal attenuated by the attenuation unit into a signal having a single phase.

10. The power amplifier of claim 8, further comprising a control unit providing an I channel control signal and a Q channel control signal for setting an attenuation level of the driving stage.

11. The power amplifier of claim 10, wherein the control unit provides the I channel control signal and the Q channel control signal for setting the attenuation level of the driving stage according to envelope information of the input RF signal.

12. The power amplifier of claim 10, wherein the control unit further provides an I channel control signal and a Q channel control signal for controlling phases of the I channel signal and the Q channel signal.

13. The power amplifier of claim 8, further comprising a rear driving stage disposed between the driving stage and the power stage, amplifying the signals attenuated by the driving stage to preset gains, or re-attenuating the signals to preset levels to transfer the signals to the power stage.

14. The power amplifier of claim 8, further comprising a front driving stage amplifying the input RF signal to a preset gain, or attenuating the signal to a preset level to transfer the signal to the driving stage.

* * * * *